(12) United States Patent
Lin

(10) Patent No.: US 12,712,552 B2
(45) Date of Patent: Aug. 18, 2026

(54) CLOCK SYNTHESIZER

(71) Applicant: Taiwan Semiconductor Manufacturing Company, Ltd., Hsinchu (TW)

(72) Inventor: Wei Shuo Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 83 days.

(21) Appl. No.: 18/789,198

(22) Filed: Jul. 30, 2024

(65) Prior Publication Data

US 2024/0388298 A1 Nov. 21, 2024

Related U.S. Application Data

(63) Continuation of application No. 18/301,850, filed on Apr. 17, 2023, now Pat. No. 12,136,925, which is a (Continued)

(51) Int. Cl.
*H03L 7/083* (2006.01)
*H03K 3/017* (2006.01)
(Continued)

(52) U.S. Cl.
CPC ............. *H03L 7/083* (2013.01); *H03K 3/017* (2013.01); *H03L 7/0818* (2013.01); *H03L 7/0998* (2013.01); *H03L 7/187* (2013.01)

(58) Field of Classification Search
CPC ... H03L 7/0814; H03L 7/0818; H03L 7/0816; H03L 7/0812; H03L 7/085; H03L 7/087; H03L 7/07; H03L 7/0805; H03L 7/08; H03L 7/0998; H03L 7/0807; H03L 7/00; H03L 7/0891; H03L 7/091; H03L 7/0995; H03L 7/18; H03L 7/081; H03L 7/093; H03L 7/0802; H03L 7/083; H03L 7/187; H03L 7/099; H03L 7/107; H03L 7/1976; H03L 1/022; H03L 2207/06; H03L 7/06; H03L 7/089; H03L 7/0895; H03L 7/0896; H03L 7/097; H03L 7/0992; H03L 7/10; H03L 7/16; H03L 7/1974; H03L 7/24; H03L 1/00; H03L 7/0898; H03L 7/103;
(Continued)

(56) References Cited

U.S. PATENT DOCUMENTS 9,444,442 B2 9/2016 Chandrasekaran et al.
10,547,298 B1 * 1/2020 Mekky ..................... H03K 7/08
(Continued)

*Primary Examiner* — John W Poos
(74) *Attorney, Agent, or Firm* — Merchant & Gould P.C.

(57) ABSTRACT

A clock synthesizer is provided. The Clock synthesizer includes a Phase Locked Loop (PLL) configured to generate a clock signal based on a reference signal. A clock buffer is connected to the PLL. The clock buffer is configured to store the clock signal. A Duty Cycle Controller and Phase Interpolator (DCCPI) circuit is connected to the clock buffer. The DCCPI circuit is configured to receive the clock signal from the clock buffer, adjust a duty cycle of the clock signal to substantially equal to 50%, perform phase interpolation on the clock signal, and provide the clock signal as an output after adjusting the duty cycle substantially equal to 50% and performing the phase interpolation.

20 Claims, 10 Drawing Sheets

Related U.S. Application Data continuation of application No. 17/566,156, filed on Dec. 30, 2021, now Pat. No. 11,632,115.

(60) Provisional application No. 63/188,727, filed on May 14, 2021.

(51) Int. Cl.
*H03L 7/081* (2006.01)
*H03L 7/099* (2006.01)
*H03L 7/187* (2006.01)

(58) Field of Classification Search
CPC ..... H03L 7/1077; H03L 7/113; H03K 5/1565; H03K 5/133; H03K 5/135; H03K 2005/00052; H03K 2005/00058; H03K 2005/00241; H03K 2005/00247; H03K 2005/00273; H03K 2005/00208; H03K 3/017; H03K 5/13; H03K 2005/00026; H03K 2005/00032; H03K 5/12; H03K 5/15013; H03K 5/2481; H03K 2005/00065; H03K 5/086; H03K 3/037; H03K 5/14; H03K 19/20; H03K 2005/00039; H03K 5/00006; H03K 5/023; H03K 3/0315; H03K 7/08; H03K 2005/00019; H03K 2005/00286; H03K 3/0322; H03K 5/088; H03K 5/134; H03K 5/15066; H03K 5/151; H03K 19/0175; H03K 19/096; H03K 19/1776; H03K 3/84; H03K 5/04; H03K 5/131; H03K 19/00315; H03K 19/01742; H03K 19/017509; H03K 19/018521; H03K 19/018528; H03K 19/21; H03K 2005/00221; H03K 21/38; H03K 23/40; H03K 5/00; H03K 5/02; H03K 5/1254; H03K 5/15046; H03K 5/1515; H03K 5/1534; H03K 5/156; H03K 5/00039; H03K 3/78; G06F 1/10; G06F 13/4282; G06F 13/374; G06F 13/1689; G06F 12/0246; G06F 2212/7201; G06F 13/1694; G06F 13/364; G06F 13/404; G06F 13/4243; G06F 2212/7207; G06F 3/061; G06F 3/0659; G06F 3/0679; G06F 1/12; G06F 13/4072; G06F 30/392; G06F 30/394; G06F 1/189; G06F 1/3287; G06F 1/3296; G06F 13/20; G06F 13/36; G06F 1/04; G06F 15/167; G06F 15/17312; G06F 15/7889; G06F 9/3869; G06F 9/5038; G06F 13/423; G06F 1/06; G06F 1/08; G06F 13/4239; G06F 15/7832; G06F 15/786; G06F 13/4291; G06F 15/78; G06F 1/324; G06F 1/3265; G06F 13/382; G06F 13/42; G06F 30/367; G06F 1/26; G06F 11/104; G06F 15/163; G06F 1/14; G06F 12/00; G06F 12/0897; G06F 13/14; G06F 13/385; G06F 13/4004; G06F 13/4009; G06F 13/4027; G06F 13/4031; G06F 13/4059; G06F 13/4068; G06F 13/4221; G06F 13/4265; G06F 15/173; G06F 15/17381; G06F 15/7846; G06F 2212/2515; G06F 2213/0002; G06F 2213/0062; G06F 7/06; G06F 7/22; G06F 9/30174; G06F 9/327
See application file for complete search history.

(56) References Cited

U.S. PATENT DOCUMENTS

| | | | | |
|---|---|---|---|---|
| 10,784,847 | B1* | 9/2020 | Tandon | H03K 5/1565 |
| 11,632,115 | B2 | 4/2023 | Lin | |
| 2009/0009228 | A1* | 1/2009 | Jang | H03K 5/133 327/295 |
| 2011/0001527 | A1* | 1/2011 | Lee | H03L 7/0816 327/158 |
| 2019/0165774 | A1 | 5/2019 | Kang et al. | |
| 2019/0229712 | A1 | 7/2019 | Suzuki et al. | |
| 2020/0136599 | A1 | 4/2020 | Savary et al. | |
| 2020/0195240 | A1* | 6/2020 | Lim | H03L 7/0814 |
| 2023/0370071 | A1 | 11/2023 | Lin | |

* cited by examiner

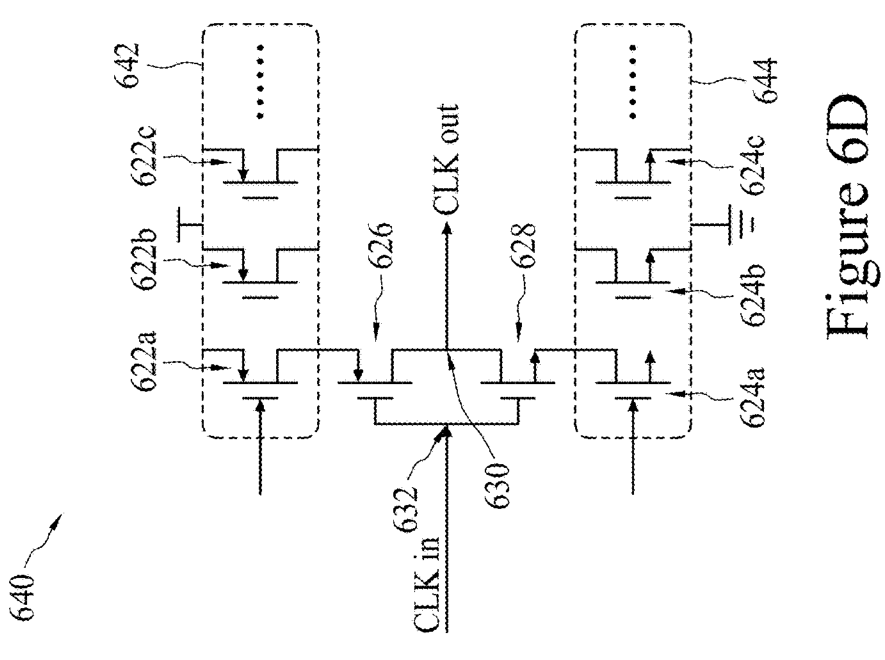
Figure 6D
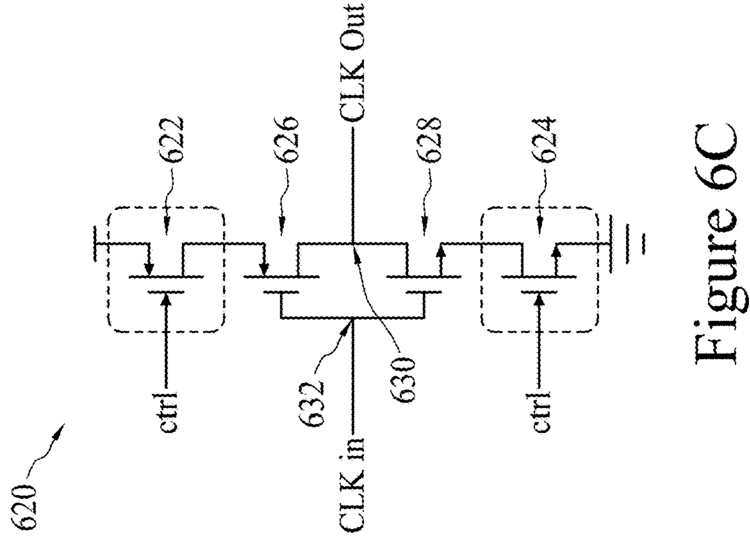
Figure 6C
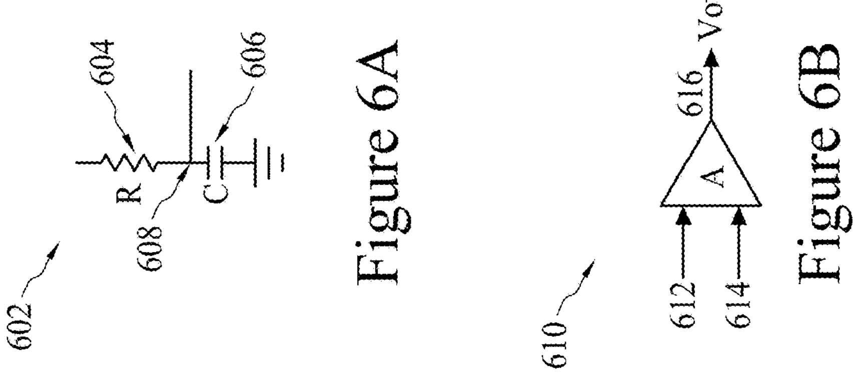
Figure 6A
Figure 6B

CLOCK SYNTHESIZER

CROSS REFERENCE TO RELATED APPLICATION

This application is a continuation of U.S. patent application Ser. No. 18/301,850, filed Apr. 17, 2023, which is a continuation of U.S. patent application Ser. No. 17/566,156, filed Dec. 30, 2021, now U.S. Pat. No. 11,632,115, which claims the benefit of U.S. Provisional Application No. 63/188,727, filed May 14, 2021, the disclosures of which are hereby incorporated herein by reference.

BACKGROUND

As system clock speeds continue to rise, signal reliability and accuracy have become increasingly important, particularly with respect to amplitude, frequency, and distortion. Providing signals with robust duty cycles has also been desirable, as many digital circuits require a precisely controlled duty cycle for proper operation. Known approaches for correcting duty cycle error and providing cycle corrected clock signals (for example, a clock signal having a 50%) duty cycle typically utilize adjustable delay circuits that are incrementally adjusted until the duty cycle of a clock signal is corrected.

The process of correcting the duty cycle can take a relatively long time, as the iterative adjustment of the delays and the duty cycle error detection can take several hundreds of clock cycles to fully correct duty cycle error. Such approaches may be unable to correct duty cycle error as quickly as may be desired. In addition, such operations require a complicated circuit and incur high power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6A illustrates an example RC circuit in accordance with some embodiments of the disclosure.

FIG. 6B illustrates an example operational amplifier in accordance with some embodiments of the disclosure.

FIG. 6C illustrates a duty cycle control circuit in accordance with some embodiments of the disclosure.

FIG. 6D illustrates another duty cycle control circuit in accordance with some embodiments of the disclosure.

DETAILED DESCRIPTION

Figure 1:
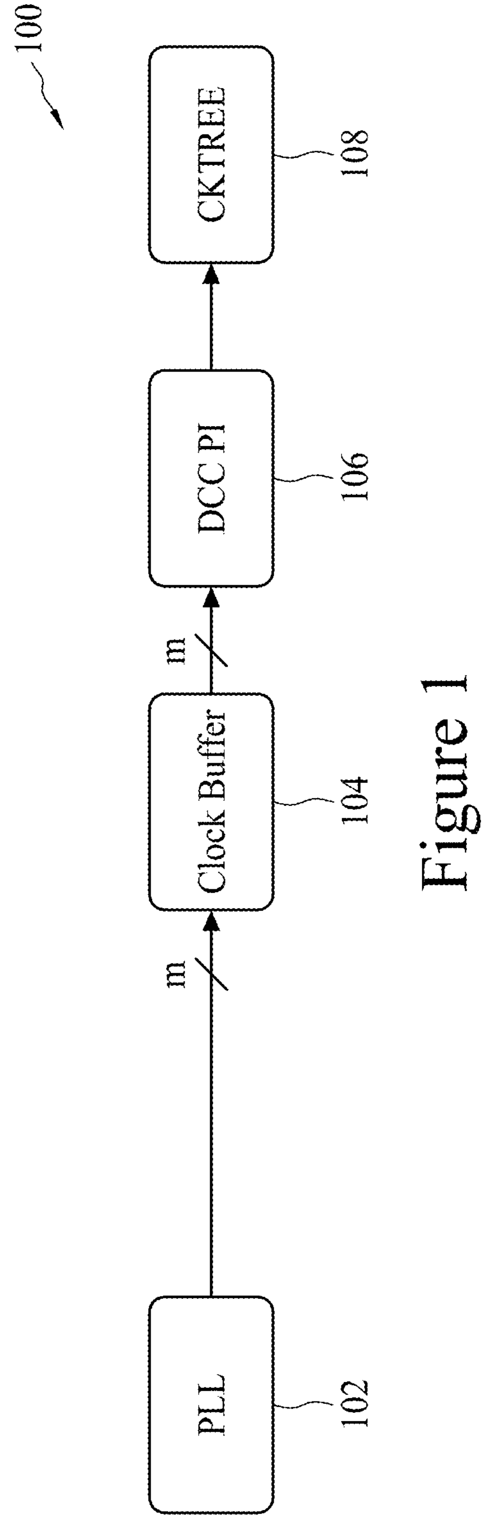
FIG. 1 is a block diagram of a clock synthesizer in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure provides a clock synthesizer which adjusts both a phase and a duty cycle of a clock signal in a single loop. For example, the clock synthesizer disclosed herein includes a Duty Cycle Corrected Phase Interpolator (DCCPI) circuit which adjusts both a phase and a duty cycle of a clock signal in a single loop. The DCCPI circuit can be used to adjust the phase and the duty cycle using a single clock signal or differential clock signals. In addition, the DCCPI circuit can use both an analog control and a digital control to adjust the phase and the duty cycle of the clock signal.

In examples, the DCCPI circuit includes a phase interpolator for adjusting the phase and a duty-cycle correct loop for correcting the duty cycle. For example, DCCPI circuit determines a difference in an average Direct Current (DC) voltage values of the clock signal and an inverted clock signal and uses the determined difference to adjust the duty cycle of the clock signal to substantially equal to 50%. In another example, DCCPI circuit determines a difference in an average DC voltage values of the clock signal and a complementary clock signal and uses the determined difference to adjust the duty cycle of the clock signal to substantially equal to 50%. By processing a feedback loop and weighted sum of multi-phases clock to attain a duty-cycle of nearly 50% for single-ended/differential signals.

FIG. 1 is a block diagram of a clock synthesizer 100 in accordance with some embodiments of the disclosure. Clock synthesizer 100 can provide a clock signal to one or more components of an Integrated Circuit (IC). As shown in FIG. 1, clock synthesizer 100 includes a Phase Locked Loop (PLL) 102 (also referred to as a PLL circuit 102), a buffer 104 (also referred to as a clock buffer 104 or a buffer circuit 104), a DCCPI circuit 106 (also referred to as DCCPI 106), and a clock tree 108. In some examples, PLL 102 and clock tree 108 may not be part of clock synthesizer 100. In addition, in some examples, clock synthesizer 100 can include more elements than shown in FIG. 1.

PLL 102 generates a clock signal based on a reference signal. In examples, PLL 102 is utilized within clock generation and distribution systems of an IC. PLL 102 generates the clock signal having a phase value that is matched with the phase value of a reference signal. In some examples, PLL 102 generates the clock signal having multiple (that is, m) phase values. For example, PLL 102 generates the clock signal having phase values of $0^{0}$, $45^{0}$, $90^{0}$, $135^{0}$, $180^{0}$, $225^{0}$, $270^{0}$, and $315^{0}$. PLL 102 provides the clock signal at an output terminal of PLL 102.

Buffer 104 is connected to PLL 102. For example, an input terminal of buffer 104 is connected to the output terminal of PLL 102. Buffer 104 receives and stores the clock signal generated by PLL 102 for a predetermined period of time and provides the stored clock signal at an output terminal. In examples, buffer 104 can be a liner buffer or a circular buffer and the predetermined period of time is configurable by configuring a length of buffer 104.

DCPPI circuit 106 is connected to buffer 104. For example, an input terminal of DCCPI circuit 106 is connected to the output terminal of buffer 104. DCCPI circuit 106 receives the clock signal from buffer 104, interpolates a phase value and adjusts the duty cycle of the received clock signal, and provides the clock signal after the phase interpolation and the duty cycle adjustment as an output at an output terminal. The clock signal provided by DCCPI circuit 106 has a duty cycle of substantially equal to 50% and a phase value matching the phase value of a reference signal. DCCPI circuit 106 is discussed in greater detail in the following portions of the disclosure.

Clock tree 108 is connected to DCCPI circuit 106. For example, an input terminal of clock tree 108 is connected to the output terminal of DCCPI circuit 106 and receives the clock signal from DCCPI circuit 106. Clock tree 108, in turn, provides the clock signal to one or more components of the IC. Clock tree 108 can include a plurality of branches and the components of the IC can be connected to the plurality of branches. In some examples, there may be a time delay between a time when clock tree 108 receives the clock signal and the time when it provides the clock signal to one or more components of the IC. This time delay in the clock signal is compensated by the phase interpolation of the clock signal as discussed in greater detail in the following portions of the disclosure.

Figure 2:
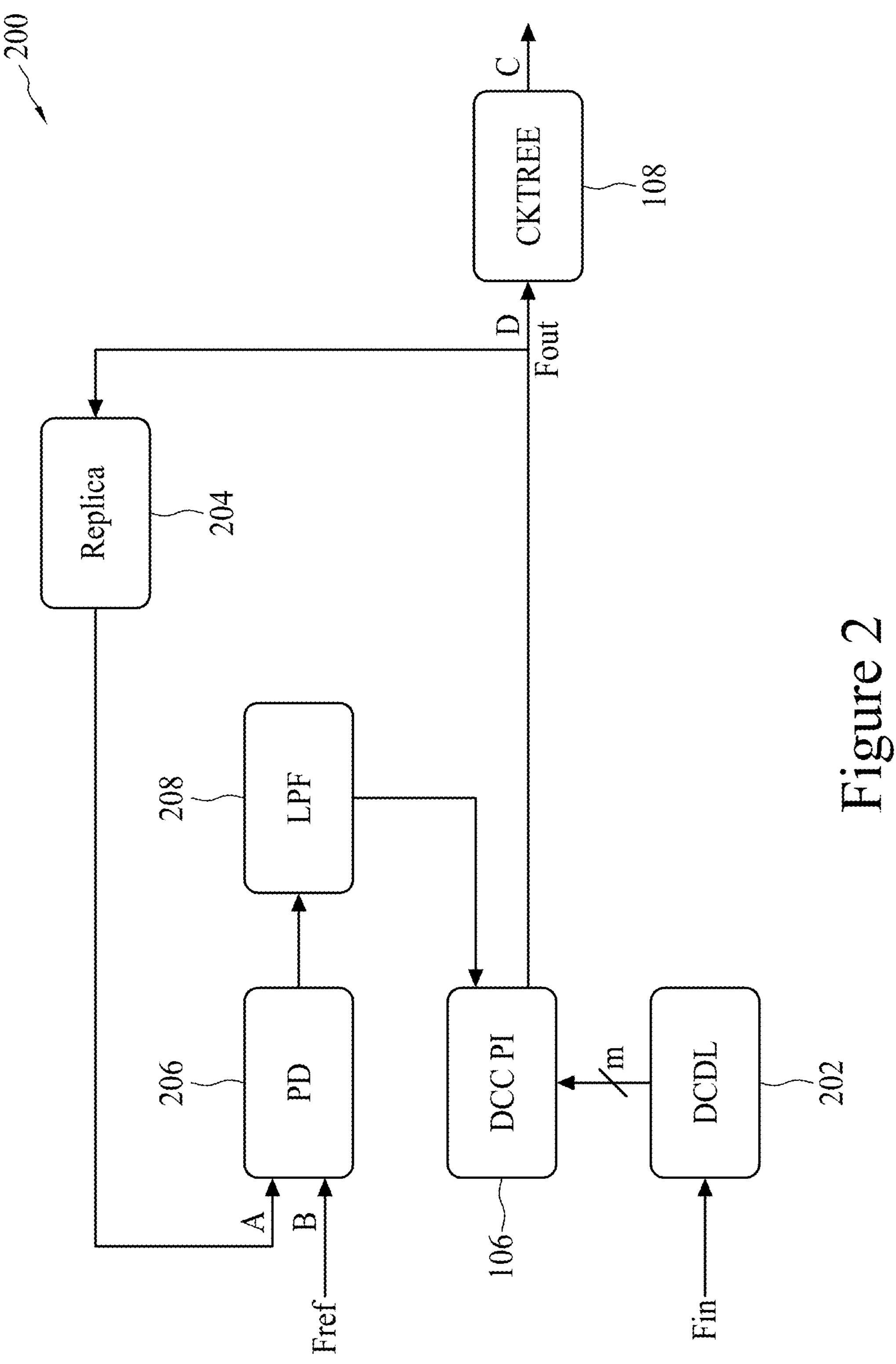
FIG. 2 is a block diagram of another clock synthesizer in accordance with some embodiments of the disclosure.

FIG. 2 is a block diagram of another clock synthesizer 200 in accordance with some embodiments of the disclosure. Clock synthesizer 100 can provide clock signal to one or more components of an IC. As shown in FIG. 2, clock synthesizer 200 includes a Digital Control Delay Line (DCDL) circuit 202 (also referred to as a DCDL 202), DCCPI circuit 106, replica circuit 204 (also referred to as replica 204), a Phase Detector (PD) circuit 206 (also referred to as a PD 206), a Low Pass Filter (LPF) circuit 208 (also referred to as a LPF 208), and clock tree 108.

DCDL circuit 202 receives the clock signal at an input terminal and processes the received clock signal. In some examples, DCDL circuit 202 produces a programmable delay to the output with respect to the input and also adjusts a relative difference between two signals to produce a reliable data transfer. For example, DCDL circuit 200 receives the clock signal at its input, delays it by a predetermined number of samples, and provides the delayed clock signal at an output terminal. In some examples, DCDL circuit 202 includes a plurality of delay elements arranged in a sequence having an associated control input. In example embodiments, if the delay is an integer multiple of samples, the delay elements are implemented as circular buffers which allows integer delays to be computed efficiently.

DCCPI circuit 106 is connected to DCDL circuit 202. For example, an input terminal of DCCPI circuit 106 is connected to the output terminal of DCDL circuit 202. DCCPI circuit 106 receives the clock signal from DCDL circuit 202 having a first frequency (also represented as Fin) and provides the clock signal as an output having a second frequency (also represented as Fout). In some example, the second frequency is different from the first frequency or is approximately equal to the first frequency or a reference frequency (also represented as Fref). In some other examples, DCCPI circuit 106 receives the clock signal from DCDL circuit 202 having a first rising edge and provides the clock signal as an output having a second rising edge, the second rising edge being different from the first rising edge. In some example, the clock signal provided as an output by DCCPI circuit 106 has a duty cycle of approximately equal to 50%.

Replica circuit 204 is connected to DCCPI circuit 106. For example, an input terminal of replica circuit 204 is connected to the output terminal of DCCPI circuit 106. In examples, replica circuit 204 generates a replica clock signal which is a replica of the clock signal outputted by DCCPI circuit 106 and provides the replica clock signal at an output terminal.

In examples, replica circuit 204 replicates a delay time associated with propagating the clock signal through clock tree 108. That is, the replica signal created by replica circuit 204 is such that a delay time associated with the clock signal traveling from point D to point A in FIG. 2 is same as the delay time associated with the clock signal traveling from point D to C. In addition, in FIG. 2, there in an intrinsic delay between point B and point C.

PD circuit 206 is connected to replica circuit 204. For example, a first input terminal of PD circuit 206 is connected to the output terminal of replica circuit 204 and receives the replica clock signal. A second input terminal of PD circuit 206 receives the reference clock signal. In examples, PD circuit 206 compares the replica clock signal with the reference clock signal and generates a voltage signal that represents a difference in phases between the replica clock signal and the reference clock signal. In some examples, PD circuit 206 can be a frequency mixer, an analog multiplier, and a logic circuit that generates the voltage signal representing the difference in phase between the replica clock signal and the reference clock signal at an output terminal.

LPF circuit 208 is connected to PD circuit 208. For example, an input terminal of LPF circuit 208 is connected to the output terminal of PD circuit 206. LPF circuit 208 receives the voltage signal representing the phase difference between the reference clock signal and the replica clock signal from PD circuit 208, passes the voltage signal with a frequency lower than a selected cutoff frequency, and attenuates the voltage signal with frequencies higher than the selected cutoff frequency. In examples, LPF circuit 208 includes a RC circuit having a resistor R connected in series with a capacitor C.

The output of LPF circuit 208 is provided to DCCPI circuit 106. For example, an output terminal of LPF circuit 208 is connected to an input terminal of DCCPI circuit 106. DCCPI circuit 106 shifts the phase of the clock signal based on the voltage signal received from LPF circuit 208. In some example, DCCPI circuit 106 shifts the phase of the clock signal by shifting a rising edge of the clock signal. DCCPI circuit 106 also corrects the duty cycle of the clock signal to be substantially equal to 50%.

Clock tree 108 is connected to DCCPI circuit 106. For example, an output terminal of DCCPI circuit 106 is connected to an input terminal of clock tree 108. DCCPI circuit 106 provides phase shifted and duty cycle corrected clock signal to clock tree 108. Clock tree 108 provides the clock signal to one or more components of the IC.

Figure 3:
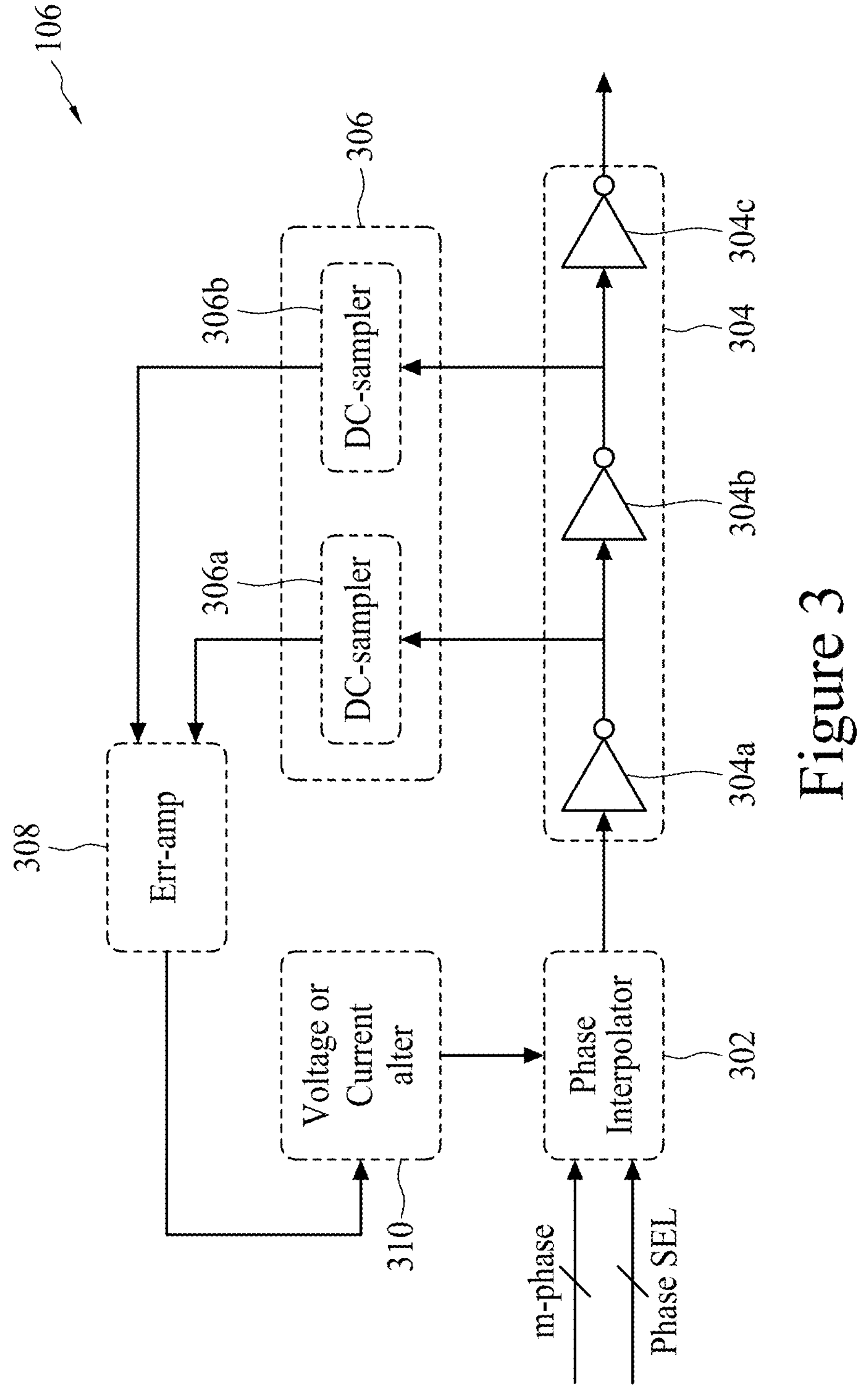
FIG. 3 is a block diagram of a Duty Cycle Corrected Phase Interpolator (DCCPI) circuit in accordance with some embodiments of the disclosure.

FIG. 3 is a block diagram of DCCPI circuit 106 in accordance with some embodiments. In examples, DCCPI circuit 106 of FIG. 3 represents a single phase analog signal DCCPI circuit 106. That is, an architecture of DCCPI circuit 106 of FIG. 3 uses only a single phase of the clock signal and analog voltage signal for the phase interpolation and the duty cycle correction. As shown in FIG. 3, DCCPI circuit 106 includes a phase interpolator 302 (also referred to as a phase interpolator circuit 302), a first invertor 304*a*, a second invertor 304*b*, a third invertor 304*c*, a first DC sampler 306*a*, a second DC sampler 306*b*, an error amplifier 308, and a voltage/current alternator 310 (also referred to as a voltage/current alternator circuit 310). In examples, first invertor 304*a*, second invertor 304*b*, and third invertor 304*c* together are also referred to as a plurality of invertors 304. In addition, first DC sampler 306*a* and second DC sampler 306*b* together are also referred to as a plurality of DC samplers 306.

Phase interpolator 302 receives the clock signal at an input terminal. In some examples, phase interpolator 302 receives the clock signal from PLL 102 through a phase selector. In examples, phase interpolator 302 receives the clock signal with a preselected phase value, for example, one of $0^0$, $45^0$, $90^0$, $135^0$, $180^0$, $225^0$, $270^0$, and $315^0$. Phase interpolator 302 adjusts the phase of the clock signal based the time delay associated with clock tree 108 and/or based on a voltage signal received from voltage/current alternator 310 and provides the clock signal back at an output terminal. In examples, phase interpolator 302 adjusts the phase of the clock signal by shifting a rising edge of the clock signal. For example, phase interpolator 302 receives the clock signal having a first rising edge and provides the clock signal as an output having a second rising edge, the second rising edge being different from the first rising edge.

First invertor 304*a* is connected to phase interpolator 302. For example, an input terminal of first invertor 304*a* is connected to the output terminal of phase interpolator 302. First invertor 304*a*, thus, receives the clock signal from phase interpolator 302 and inverts the clock signal to generate an inverted clock signal. First invertor 304*a* provides the inverted clock signal as an output at an output terminal of first invertor 304*a*.

Second invertor 304*b* is connected to first invertor 304*a*. For example, an input terminal of second invertor 304*b* is connected to the output terminal of first invertor 304*a*. Second invertor 304*b* receives the inverted clock signal from first invertor 304*a* and inverts the inverted clock signal to generate the clock signal. Second invertor 304*b* provides the clock signal as an output at an output terminal of second invertor 304*b*.

Third invertor 304*c* is connected to second invertor 304*b*. For example, an input terminal of third invertor 304*c* is connected to the output terminal of second invertor 304*b*. Third invertor 304*c* receives the clock signal from second invertor 304*b* and inverts the clock signal to generate the inverted clock signal. Third invertor 304*c* provides the clock signal as an output at an output terminal of third invertor 304*c*. In some examples, each of first invertor 304*a*, second invertor 304*b*, and third invertor 304*c* is a NOT logic gate.

First DC sampler 306*a* is connected to first invertor 304*a*. For example, an input terminal of the first invertor 304*a* is connected to the output terminal of first invertor 304*a*. In examples, first DC sampler 306*a* determines an average DC voltage value of the inverted clock signal and provides the average DC voltage value of the inverted clock signal as an output at an output terminal.

Second DC sampler 306*b* is connected to second invertor 304*a*. For example, an input terminal of second DC sampler 306*b* is connected to the output terminal of second invertor 304*b*. In examples, second DC sampler 306*b* determines an average DC voltage value of the clock signal and provides the average DC voltage value of the clock signal as an output at an output terminal.

In examples, each of first DC sampler 306*a* and second DC sampler 306*b* is a RC circuit. FIG. 6A illustrates an example RC circuit 602 in accordance with some embodiments of the disclosure. As shown in FIG. 6A, RC circuit 602 includes a resistive element 604 (also referred to as a resistor R 604) and an energy storage device 606 (also referred to as a capacitor C 606). A second terminal of resistor R 604 is connected to a first terminal of capacitor C 606 at node 608. A second terminal of capacitor C 606 is connected to the ground or a ground voltage node. An output of RC circuit 602 is received at node 608. The clock signal or the inverted clock signal is provided as an input at a first terminal of resistor R 604 and the average DC voltage value of the clock signal or the average DC voltage value of the inverted clock signal is received at node 608.

Referring back to FIG. 3, error amplifier 308 is connected to both first DC sampler 306*a* and second DC sampler 306*b*. For example, a first input terminal of error amplifier 308 is connected to the output terminal of first DC sampler 306*a* and a second input terminal of error amplifier 308 is connected to the output terminal of second DC sampler 306*b*. Error amplifier 308 compares the average DC voltage value of the clock signal with the average DC voltage value of the inverted clock signal and provides a voltage signal as an output based on the comparison.

In examples, error amplifier 308 comprises an operational amplifier with differential inputs and a single output. In this configuration, the operation amplifier produces the voltage signal that is approximately 10,000 times larger than the potential difference between its input terminals. FIG. 6B illustrates an example operational amplifier 610 in accordance with example embodiments of the disclosure. As shown in FIG. 6B, operational amplifier 610 includes a first input terminal 612, a second input terminal 614, and an output terminal 616. In examples, the average DC voltage value of the clock signal is provided at first input terminal 612 and the average DC voltage value of the inverted clock signal is provided at second input terminal 614. In some examples, the average DC voltage value of the clock signal is provided at second input terminal 614 and the average DC voltage value of the inverted clock signal is provided at first input terminal 612. The voltage signal representing the difference between the average DC voltage value of the clock signal and the average DC voltage value of the inverted clock signal is received at output terminal 616.

Returning back to FIG. 3, voltage/current alternator 310 is connected to error amplifier 308 and receives the voltage signal representative of a difference between the average DC voltage value of the clock signal and the average DC voltage value of the inverted clock signal from error amplifier 308. For example, an input terminal of voltage/current alternator 310 is connected to the output terminal of error amplifier 308. Voltage/current alternator 310 alters or adjusts the duty cycle of the clock signal based on the voltage signal. In examples, voltage/current alternator 310 adjusts the duty cycle of the clock signal to be substantially equal to 50% by minimizing the difference between the average DC voltage value of the clock signal and the average DC voltage value of the inverted clock signal. For example, voltage/current alternator 310 determines if the difference between the average DC voltage value of the clock signal and the average DC voltage value of the inverted clock signal is substantially equal to zero. In response to determining that the difference between the average DC voltage value of the clock signal and the average DC voltage value of the inverted clock signal is not equal to zero, voltage/current alternator 310 adjusts the duty cycle of the clock signal. For example, voltage/current alternator 310 decreases the duty cycle of the clock signal when the difference between the average DC voltage value of the clock signal and the average DC voltage value of the inverted clock signal is more than zero (that is, the voltage signal is more than a predetermined level). Moreover, voltage/current alternator 310 increases the duty cycle of the clock signal when the difference between the average DC voltage value of the clock signal and the average DC voltage value of the inverted clock signal is less than zero (that is, the voltage signal is less than the predetermined level). Thus, in some examples, voltage/current alternator 310 minimizes the difference between the average DC voltage value of the clock signal and the average DC voltage value of the inverted clock signal to be substantially equal to zero.

In example embodiment, voltage/current alternator 310 comprises a first transistor and a second transistor. FIG. 6C illustrates a first duty cycle control circuit 620 in accordance with some embodiments of the disclosure. As shown in FIG. 6C, first duty cycle control circuit 620 includes a first transistor 622, a second transistor 624, a third transistor 626, and a fourth transistor 628. A drain of first transistor 622 is connected to a source of third transistor 626. A drain of third transistor 626 is connected to a drain of fourth transistor 628 at an output node 632. A source of fourth transistor 628 is connected a drain of second transistor 624 and a source of second transistor 624 is connected to the ground. A gate of third transistor 626 is connected to a gate of fourth transistor 628 at an input node 632.

In examples, first transistor 622 and third transistor 626 are p-channel Metal Oxide Semiconductor (PMOS) transistors and second transistor 624 and fourth transistor 628 are n-channel Metal Oxide Semiconductor (NMOS) transistors. However, other types of transistors are within the scope of the disclosure. Moreover, each of first transistor 622, second transistor 624, third transistor 626, and fourth transistor 628 are symmetrical. That is, a drain of each of first transistor 622, second transistor 624, third transistor 626, and fourth transistor 628 can be a source and a source of each of first transistor 622, second transistor 624, third transistor 626, and fourth transistor 628 can be a drain.

In examples, first transistor 622 and second transistor 624 form voltage/current alternator 310. The voltage signal received from error amplifier 308 is used as a control signal which is provided at the gate of each of the first transistor 622 and second transistor 624. The clock signal is provided at input node 632 and the clock signal with modified duty cycle is outputted at output node 630. The duty cycle is modified by using the control signal to manipulate a drain-to-source resistance value of first transistor 622 and second transistor 624.

For example, when the voltage signal is more than a predetermined level, then the drain-to-source resistance value of first transistor 622 is increased and the drain-to-source resistance value of second transistor 624 is decreased to decrease the duty cycle of the clock signal. In addition, when the voltage signal is less than the predetermined level, then the drain-to-source resistance value of first transistor 622 is decreased and the drain-to-source resistance value of second transistor 624 is increased to increase the duty cycle of the clock signal.

Although, circuit 620 of FIG. 6C is shown to include a single PMOS transistor and a single NMOS transistor to adjust the duty cycle of the clock signal, it will be apparent to a person with skill in the art after reading this disclosure that multiple PMOS transistors and NMOS transistors can be used to control the duty cycle of the clock signal.

FIG. 6D illustrates another duty cycle control circuit 630 in accordance with some embodiments of the disclosure. As shown in FIG. 6D, duty cycle control circuit 630 of FIG. 6D includes first cascade of transistors 632, a second cascade of transistors 634, third transistor 626, and fourth transistor 628. First cascade of transistors 632 includes multiple first transistors (labeled as 622*a*, 622*b*, 622*c*, . . . ) connected in parallel to each other. For example, a source of each of the multiple first transistors of first cascade of transistors 632 is connected to a supply voltage node and a drain of each of each of the multiple first transistors of first cascade of transistors 632 is connected to a source of third transistor 626. A gate of each of the multiple first transistors of first cascade of transistors 632 is connected to a control signal which can selectively switch on or switch off each of the multiple first transistors of first cascade of transistors 632. The control signal is linked to the voltage signal of error amplifier 308.

Similarly, second cascade of transistors 634 includes multiple second transistors (labeled as 624*a*, 624*b*, 624*c*, . . . ) connected in parallel to each other. For example, a source of each of the multiple second transistors of second cascade of transistors 634 is connected to the ground or a ground voltage node and a drain of each of the multiple second transistors of second cascade of transistors 634 is connected to the drain of fourth transistor 628. A gate of each of the multiple second transistors of second cascade of transistors 634 is connected to a control signal which can selectively switch on or switch off each of the multiple second transistors of second cascade of transistors 634. In examples, a number of transistors in each of first cascade of transistors 632 and second cascade of transistors 634 is configurable.

A drain of third transistor 626 is connected to a drain of fourth transistor 628 at output node 632. A gate of third transistor 626 is connected to a gate of fourth transistor 628 at input node 632. The clock signal is provided at input node 632 and the clock signal with modified duty cycle is outputted at output node 630.

For example, when the voltage signal at the output of error amplifier 308 is greater than a predetermined level, then the drain-to-source resistance value of first cascade of transistors 632 is increased and the drain-to-source resistance value of second cascade of transistors 634 is decreased to decrease the duty cycle of the clock signal. The drain-to-source resistance value of first cascade of transistors 632 is increased by switching on one or more additional transistors in first cascade of transistors 632 and the drain-to-source resistance value of second cascade of transistors 634 is decreased by switching off one or more of switched on transistors in second cascade of transistors 634.

In addition, when the voltage signal at the output of error amplifier 308 is less than the predetermined level, then the drain-to-source resistance value of first transistor 622 is decreased and the drain-to-source resistance value of second transistor 624 is increased to increase the duty cycle of the clock signal. The drain-to-source resistance value of first cascade of transistors 632 is decreased by switching off one or more of switched on transistors in first cascade of transistors 632 and the drain-to-source resistance value of second cascade of transistors 634 is increased by switching on one or more additional transistors in second cascade of transistors 634. The transistors in first cascade of transistors 632 and second cascade of transistors 634 are switched on or off using the control signal which is tied to the voltage signal at the output of error amplifier 308.

Figure 6E:
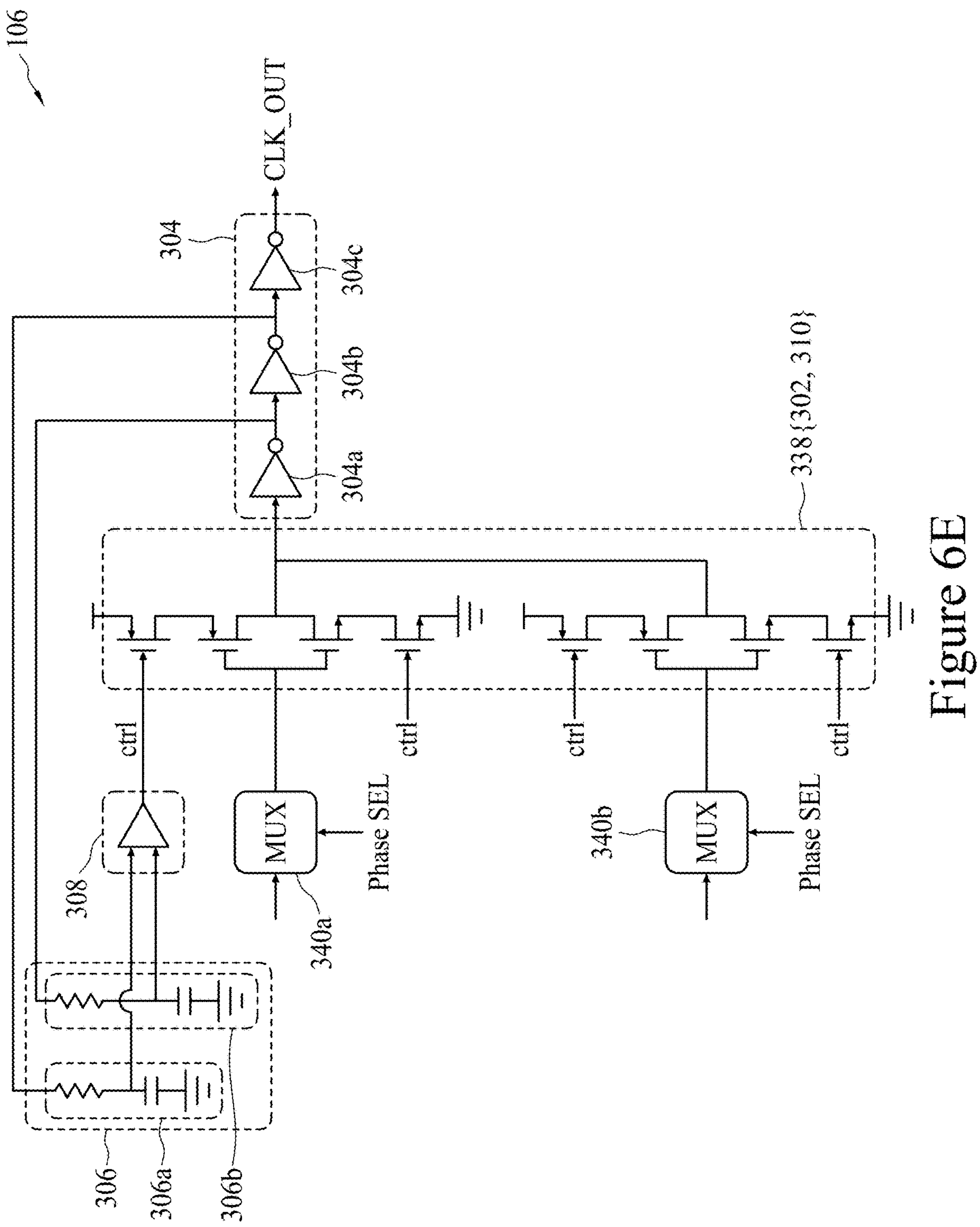
FIG. 6E illustrates a circuit diagram of a DCCPI circuit in accordance with some embodiments of the disclosure.

FIG. 6E illustrates a circuit diagram of a DCCPI circuit 106 in accordance with some embodiments of the disclosure. As shown in FIG. 6E, DCCPI circuit 106 includes plurality of invertors 304 (for example, first invertor 304*a*, second invertor 304*b*, and third invertor 304*c*), plurality of DC samplers 306 (for example, first DC sampler 306*a* and second DC sampler 306*b*), error amplifier 308, a phase interpolator duty cycle alternator 338, a first multiplexer 340*a*, and a second multiplexer 340*b*. Phase interpolator duty cycle alternator 338 includes phase interpolator 302 and voltage/current alternator 310.

Each of first multiplexer 340*a* and second multiplexer 340*b* receive a clock signal having a plurality of phase values. Respective phase selectors select one of the plurality of phase values and provides the clocks signals with the selected phase values to phase interpolator duty cycle alternator 338. For example, a first phase selector associated with first multiplexer 340*a* choses the clock signal with phase value $0^0$ while a second phase selector associated with second multiplexer 340*b* choses the clock signal with phase value $45^0$. Phase interpolator duty cycle alternator 338 performs phase interpolation and duty cycle correction on the received clock signal and provide phase corrected and duty cycle corrected clock signal as an output. First invertor 304*a* receives the clock signal as an input from phase interpolator duty cycle alternator 338 provides an inverted clock signal as an output. Second invertor 304*b* receives the inverted clock signal as an input from first invertor 304*a*, inverts the inverted clock signal, and provides the clock signal as an output. Third invertor 304*c* receives the clock signal as an input from second invertor 304*b* provides an inverted clock signal as an output.

First DC sampler 306*a* receives the clock signal from second invertor 304*b* and determines the average DC voltage value of the clock signal. Second DC sampler 306*b* receives the inverted clock signal from first invertor 304*a* and determines the average DC voltage value of the inverted clock signal. Error amplifier 308 receives the average DC voltage value of the clock signal from first DC sampler 306*a* and receives the average DC voltage value of the inverted clock signal from second DC sampler 306*b*. Error amplifier 308 determines a difference between the average DC voltage value of the clock signal and the average DC voltage value of the inverted clock signal and provides a control signal indicative of the determined difference to phase interpolator duty cycle alternator 338. Phase interpolator duty cycle alternator 338 corrects the duty cycle of the clock signal based on the control signal.

Figure 4:
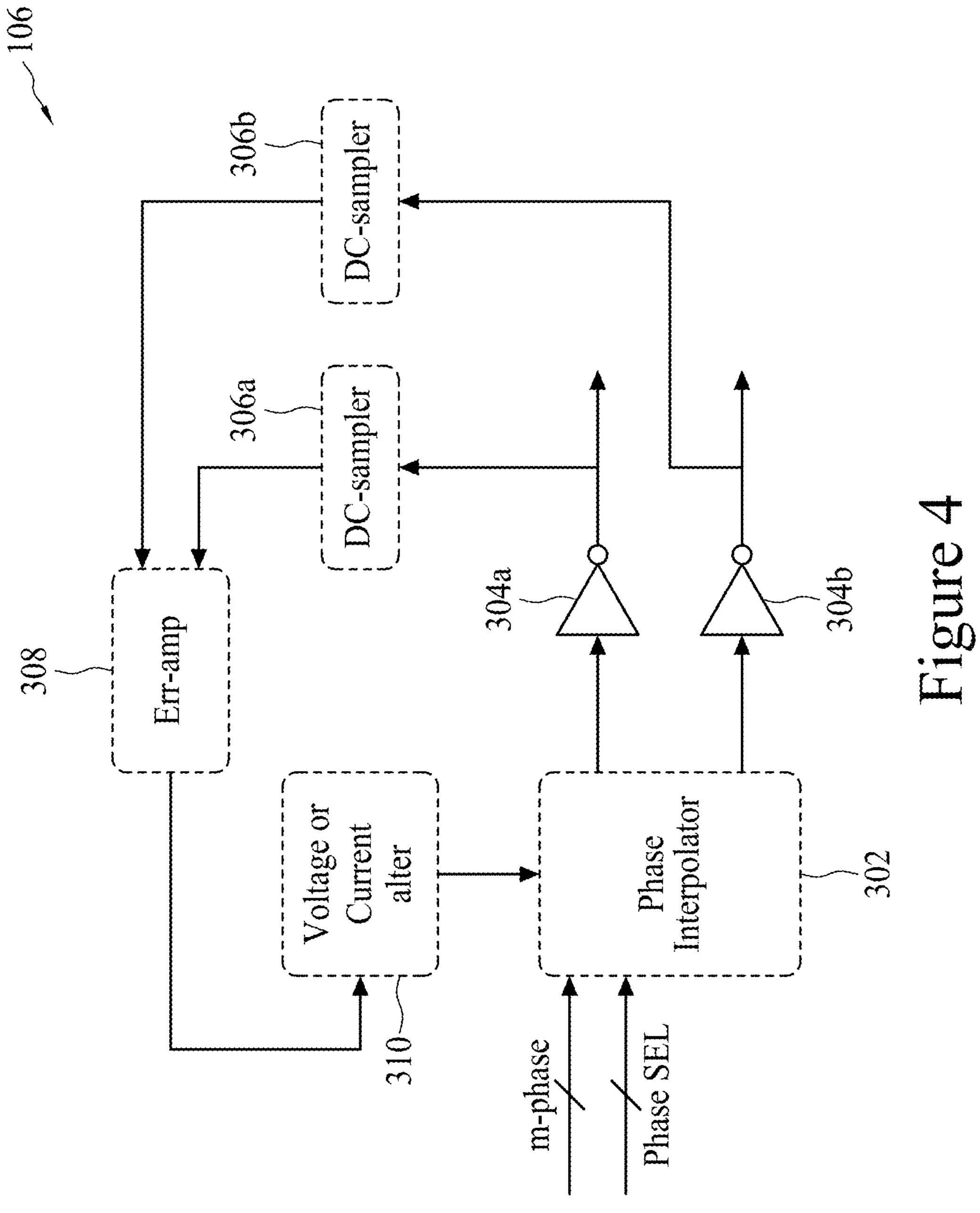
FIG. 4 illustrates a block diagram of another DCCPI circuit in accordance with some embodiments of the disclosure.

In example embodiments, DCCPI circuit 106 discussed with reference to FIG. 3 is uses a single clock signal for the duty cycle correction and the phase interpolation. However, DCCPI circuit 106 can perform the duty cycle correction and the phase interpolation using differential clock signals. FIG. 4 illustrates a block diagram of DCCPI circuit 106 which uses the differential clock signals and the analog voltage signal for the duty cycle correction and the phase interpolation. For example, DCCPI circuit 106 of FIG. 4 use two complementary clock signals for duty cycle correction and phase interpolation.

As shown in FIG. 4, DCCPI circuit 106 includes phase interpolator 302, first invertor 304*a*, second invertor 304*b*, first DC sampler 306*a*, second DC sampler 306*b*, error amplifier 308, and voltage/current alternator 310. Phase interpolator 302 of DCCPI circuit 106 of FIG. 4 includes a first output terminal and a second output terminal. The first output terminal of phase interpolator 302 provides the clock signal having a first phase value and the second output terminal of phase interpolator 302 provides the clock signal having a second phase value. The second phase value may be complementary to the first phase value. For example, the first phase value may be $0^0$ and the second phase may be $180^0$ value. In some example, the clock signal with the first phase value is also referred to as the first clock signal and the clock signal with the second phase value is also referred to as the second clock signal. The first clock signal and the second clock signals are referred to as differential clock signals.

First invertor 304*a* is connected to the first output terminal of phase interpolator 302 and inverts the clock signal with the first phase value. Second invertor 304*b* is connected to the second output terminal of phase interpolator 302 inverts the clock signal with the first phase value. First DC sampler 306*a* is connected to first invertor 304*a* and determines the average DC voltage value of the inverted clock signal with the first phase value. Second DC sampler 306*a* is connected to second invertor 304*b* and determines the average DC voltage value of the inverted clock signal with the second phase value. Error amplifier 308 compares the average DC voltage value of the inverted clock signal with the first phase value with the average DC voltage value of the inverted clock signal with the second phase value and provides the voltage signal based on the comparison. Voltage/current alternator 310 is connected to error amplifier 308 and corrects the duty cycle of the clock signal based on the voltage signal received from error amplifier 308 as discussed above with reference to FIGS. 6C and 6D.

Figure 5:
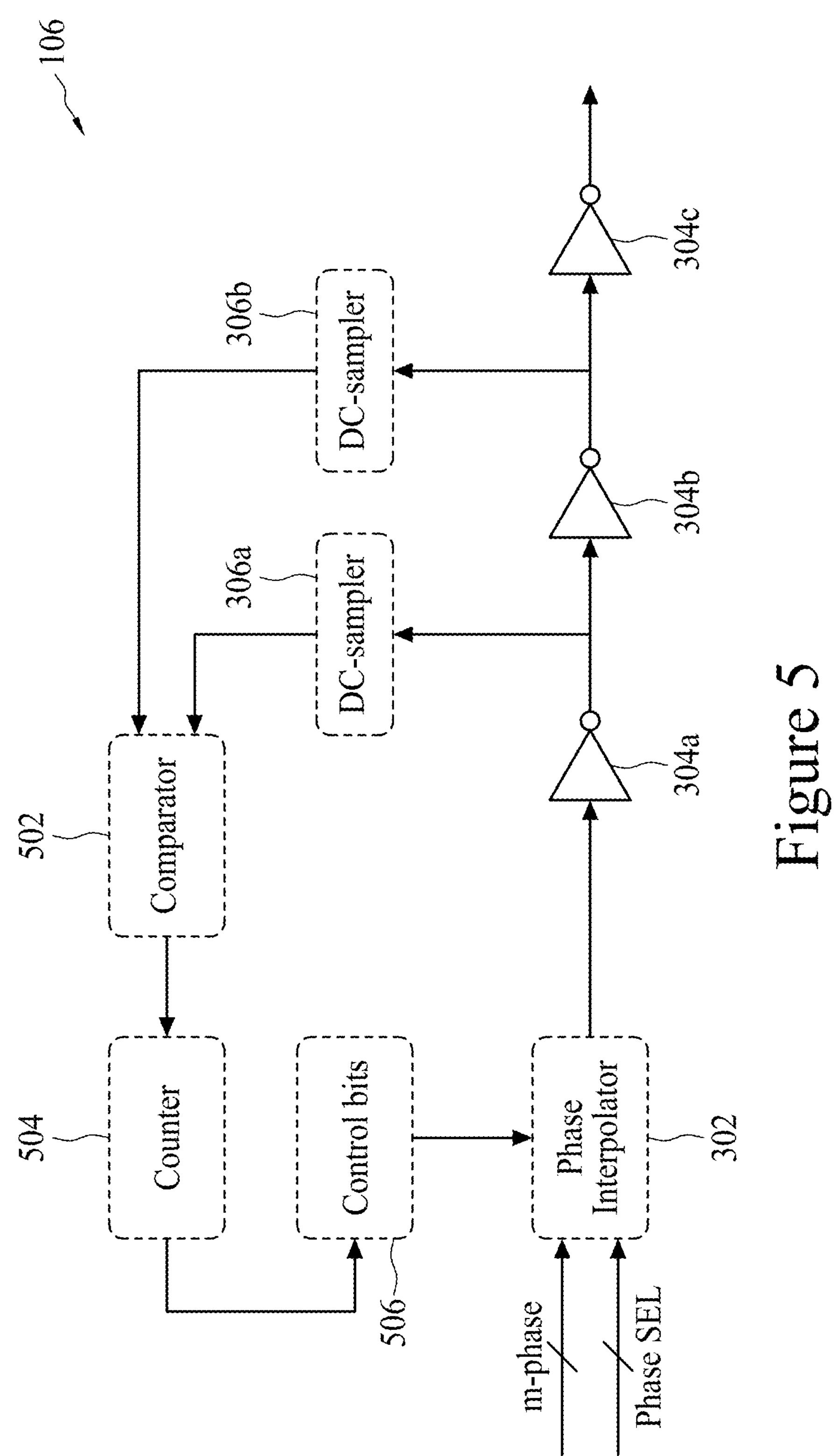
FIG. 5 is a block diagram of yet another DCCPI circuit in accordance with some embodiments.

In examples, the architectures shown for DCCPI circuit 106 with reference to FIGS. 3 and 4 are also referred to as analog feedback loops as DCCPI circuit 106 of FIGS. 3 and 4 uses analog voltage signal for the phase interpolation and the duty cycle correction. FIG. 5, on the other hand, is a block diagram of DCCPI circuit 106 with a digital feedback loop in accordance with some embodiments. As shown in FIG. 5, DCCPI circuit 106 of FIG. 5 includes phase interpolator 302, first invertor 304*a*, second invertor 304*b*, third invertor 304*c*, first DC sampler 306*a*, second DC sampler 306*b*, a comparator 502 (also referred to as comparator circuit 502), a counter 504 (also referred to as a counter circuit 504), and a control bits 506 (also referred to as control bits circuit 506).

Phase interpolator 302 receives the clock signal at an input terminal, for example, from PLL 102 through a phase selector. Phase interpolator 302 adjusts the phase of the clock signal and provides the clock signal at an output terminal. First invertor 304*a* is connected to the output terminal of phase interpolator 302. First invertor 304*a* receives the clock signal from phase interpolator 302 and inverts the clock signal to generate an inverted clock signal. First invertor 304*a* provides the inverted clock signal as an output at an output terminal.

Second invertor 304*b* is connected to first invertor 304*a*. Second invertor 304*b* receives the inverted clock signal from first invertor 304*a* and inverts the inverted clock signal to generate the clock signal. Second invertor 304*b* provides the clock signal as an output at an output terminal. Third invertor 304*c* is connected to second invertor 304*b*. Third invertor 304*c* receives the clock signal from second invertor 304*b* and inverts the clock signal to generate the inverted clock signal. Third invertor 304*c* provides the clock signal as an output at an output terminal.

First DC sampler 306*a* is connected to the output terminal of first invertor 304*a*. First DC sampler 306*a* determines an average DC voltage value of the inverted clock signal and provides the average DC voltage value of the inverted clock signal as an output at an output terminal. Second DC sampler 306*b* is connected to the output terminal of second invertor 304*a*. Second DC sampler 306*b* determines an average DC voltage value of the clock signal and provides the average DC voltage value of the clock signal as an output at an output terminal.

Comparator 502 is connected to both first DC sampler 306*a* and second DC sampler 306*b*. For example, a first input terminal of comparator 502 is connected to the output terminal of first DC sampler 306*a* and a second input terminal of comparator 502 is connected to the output terminal of second DC sampler 306*b*. In examples, one of the first input terminal and the second input terminal of comparator 502 is labeled as positive input terminal (represented as $V_+$) and the other input terminal of comparator 502 is labeled as the negative terminal (represented as $V_-$). Comparator 502 compares the average DC voltage value of the clock signal with the average DC voltage value of the inverted clock signal and provides a digital signal indicating which is larger. For example, the output of comparator 502 (also referred to as Vo) is represented as:

$$V_0 = \begin{cases} 1, & \text{if } V_+ > V_- \\ 0, & \text{if } V_+ < V_- \end{cases}$$

where $V_+$ and $V_-$ is one of the average DC voltage value of the clock signal and the average DC voltage value of the inverted clock signal. Thus, the output of comparator 502 is a first value (that is, bit value 1) when the average DC voltage value is greater at the positive terminal compared to the negative terminal and a second value (that is, bit value 0) when the average DC voltage value is less at the positive terminal compared to the negative terminal.

Counter 504 is connected to comparator 502. For example, an input terminal of counter 504 is connected to the output terminal of comparator 502. Counter 504 counts a number of outputs from comparator 502 and provides the number of outputs at an output terminal. For example, counter 504 counts a number of bit value 1 and bit value 0.

Control bits 506 is connected to counter 504. For example, an input terminal of control bits 506 is connected to the output terminal of counter 504. Control bits 506 receives the number of bit value 1 and bit value 0 from counter 504 and adjusts the duty cycle of the clock signal. For example, when the output of counter includes the bit value 1, then control bits 506 decreases the duty cycle of the clock signal. Moreover, when the output of counter includes the bit value 0, then control bits 506 increases the duty cycle of the clock signal. Control bits 506 adjusts the duty cycle of the clock cycle similar to that of voltage/current alternator 310 discussed with reference to FIGS. 3, 6A, and 6B. In some example, control bits 506 and the control signal generated for the phase interpolation and duty cycle correction are stored.

Figure 7:
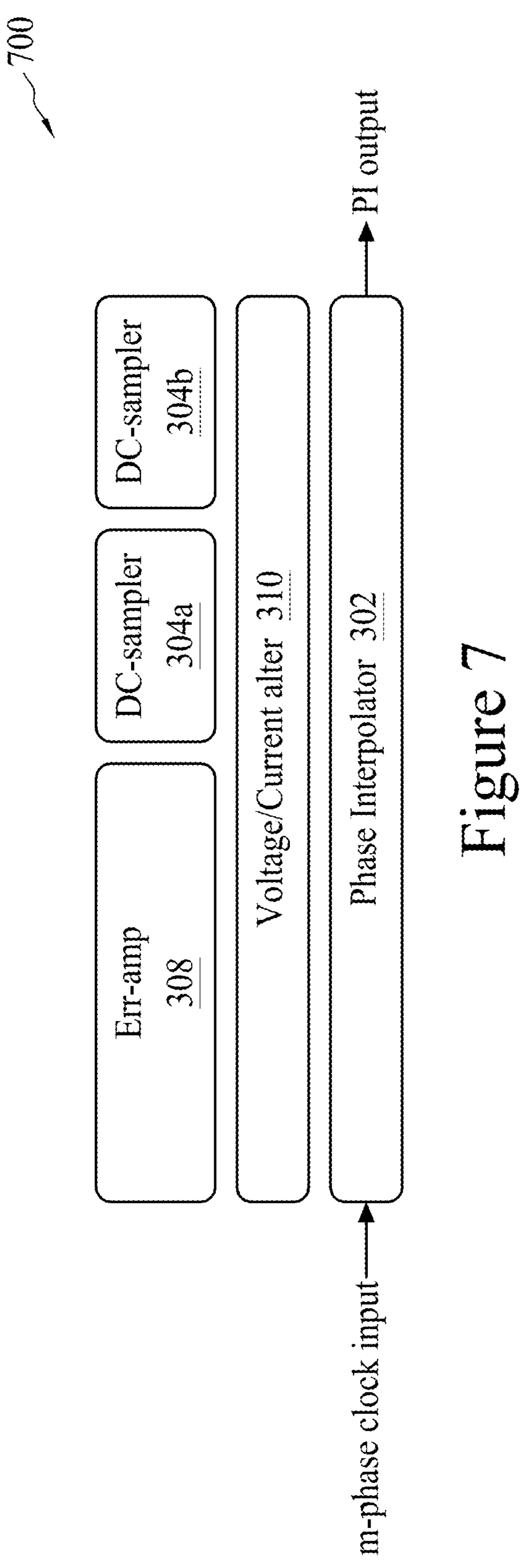
FIG. 7 illustrates a placement diagram of the DCCPI circuit of FIG. 3 and FIG. 4 in accordance with some embodiments of the disclosure.

FIG. 7 illustrates a placement diagram 700 of DCCPI circuit 106 of FIG. 3 and FIG. 4 in accordance with some embodiments of the disclosure. Placement diagram 700 of FIG. 7 illustrates example relative positions of components of DCCPI circuit 106 of FIG. 3 and FIG. 4 on a chip. For example, and as shown in placement diagram 700, phase interpolator 302 and its components are formed in a single row. Voltage/current alternator 310 and its components are formed in another single row next to the single row which includes phase interpolator 302. Error amplifier 308, first DC sampler 304*a*, and second DC sampler 304*b* are formed in yet another row which is next the row which includes voltage/current alternator 310. Thus, voltage/current alternator 310 is sandwiched between phase interpolator 310 and error amplifier 308, first DC sampler 304*a*, and second DC sampler 304*b*. In addition, first DC sampler 304*a* is sandwiched between error amplifier 308 and second DC sampler 304*b*. In an alternative configuration, second DC sampler 304*b* can be sandwiched between error amplifier 308 and first DC sampler 304*a*. In another alternative configuration, error amplifier 308 can be sandwiched between first DC sampler 304*a* and second DC sampler 304*b*.

Figure 8:
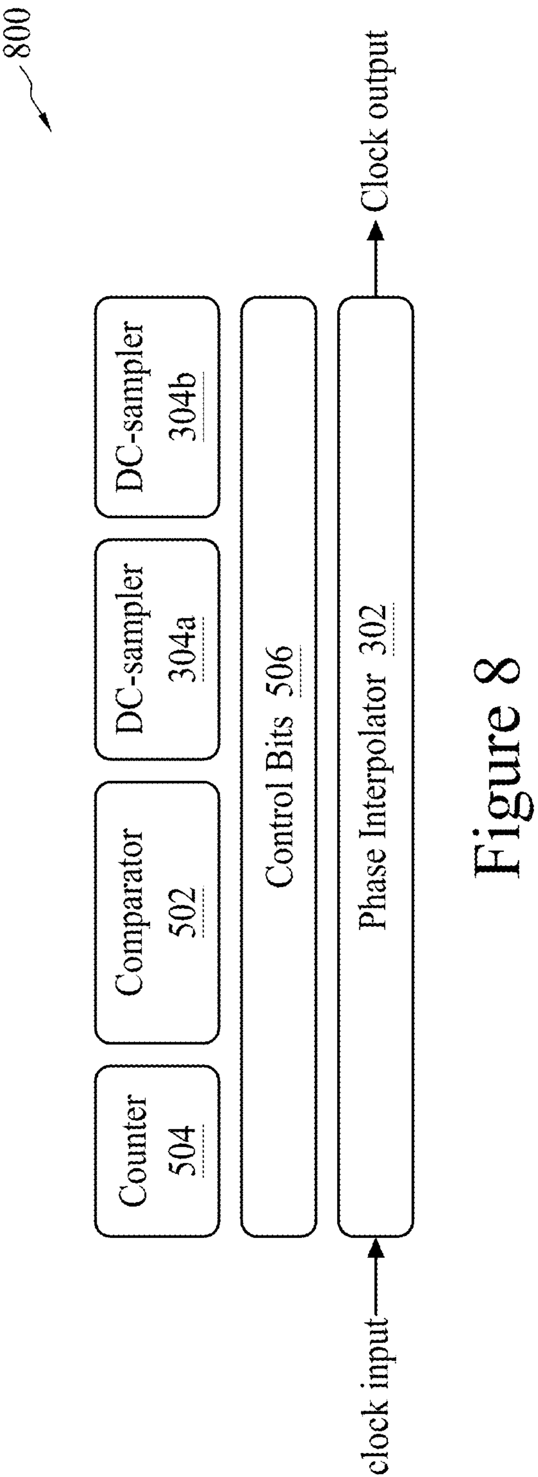
FIG. 8 illustrates a placement diagram of the DCCPI circuit of FIG. 5 in accordance with some embodiments of the disclosure.

FIG. 8 illustrates a placement diagram 800 of DCCPI circuit 106 of FIG. 5 in accordance with some embodiments of the disclosure. Placement diagram 800 of FIG. 8 illustrates example relative positions of components of DCCPI circuit 106 of FIG. 5 on a chip. For example, and as shown in placement diagram 800, phase interpolator 302 and its components are formed in a single row. Control bits 506 and its components are formed in another single row next to the row which includes phase interpolator 302. Counter 504, comparator 502, first DC sampler 304*a*, and second DC sampler 304*b* are formed in yet another row which is next the row which includes control bits 506. Thus, control bits 506 is sandwiched between phase interpolator 302 and counter 504, comparator 502, first DC sampler 304*a*, and second DC sampler 304*b*. In addition, comparator 502 is formed next to counter 504, first DC sampler 304*a* is formed next to comparator 502, and second DC sampler 304*b* is formed next to first DC sampler 304*a*. In an alternative configuration, second DC sampler 304*b* can be formed next comparator 502 and first DC sampler 304*a* can be formed next to second DC sampler 304*b*. In another alternative configuration, second DC sampler 304*b* can be formed next counter 504 and first DC sampler 304*a* can be formed next to second DC sampler 304*b*.

Figure 9:
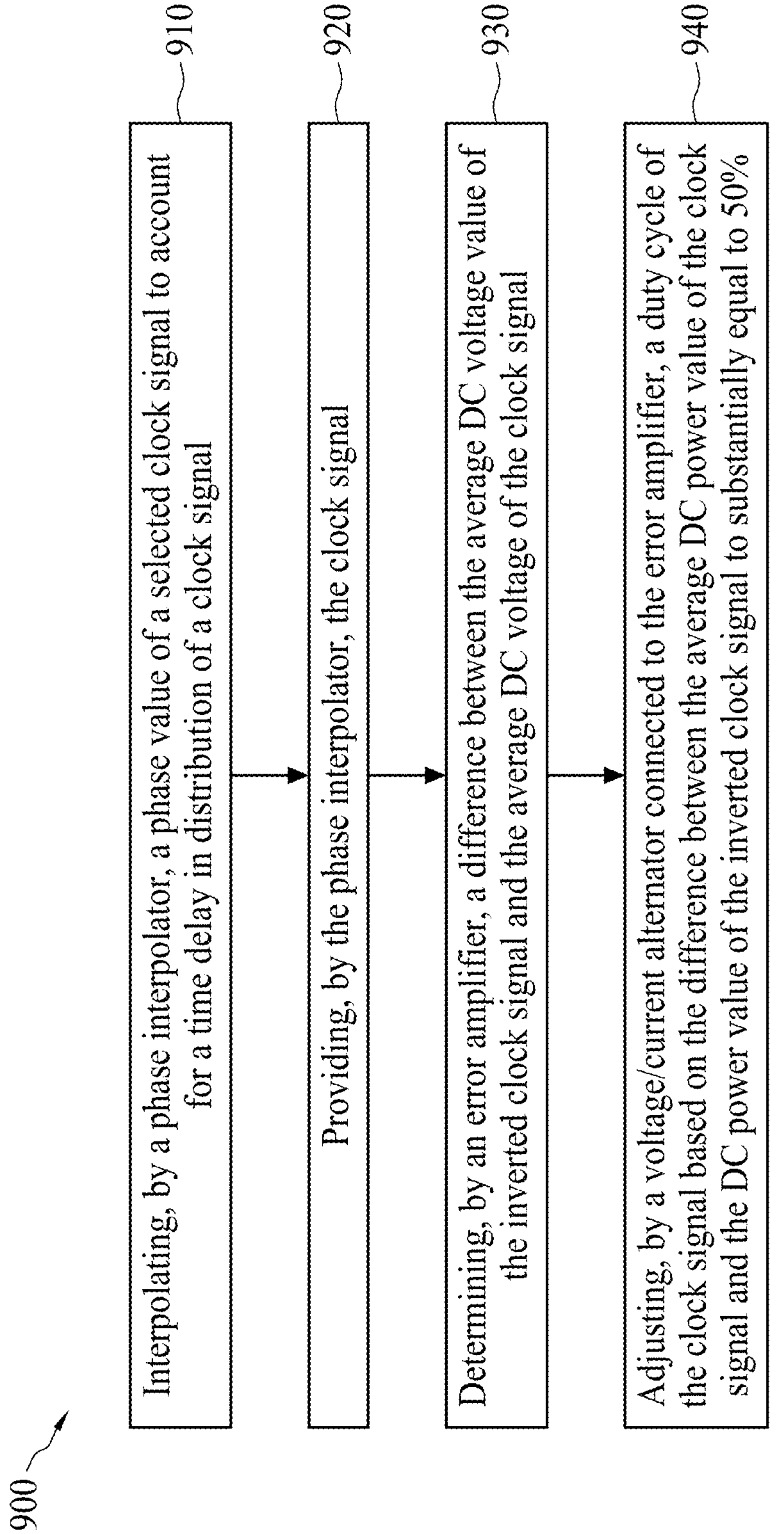
FIG. 9 is a flow diagram of a method for adjusting a phase and a duty cycle of a clock signal in accordance with example embodiments.

FIG. 9 is a flow diagram of a method 900 for phase interpolation and duty cycle correction for an input clock signal in accordance with example embodiments. In example embodiments, method 900 can be practiced in devices and circuits discussed in this disclosure with reference to FIGS. 1-8.

At block 910 of method 900, phase interpolator 302 interpolates a phase value of a selected clock signal to account for a time delay in distribution of a clock signal. For example, phase interpolator 302 receives a selected clock signal at an input terminal. In some examples, phase interpolator 302 receives the selected clock signal from PLL 102 through a phase selector having a first phase (for example, one of $0^{\circ}$, $45^{\circ}$, $90^{\circ}$, $135^{\circ}$, $180^{\circ}$, $225^{\circ}$, $270^{\circ}$, and $315^{\circ}$). Phase interpolator 302 adjusts the phase of the clock signal based the delay time associated with clock tree 108 or based on a voltage signal received from voltage/current alternator 310. At block 920 of method 900, phase interpolator 302 provides the clock signal back at an output terminal. For example, phase interpolator 302 receives the clock signal having a first rising edge and provides the clock signal having a second rising edge.

At block 930 of method 900, error amplifier 308 determines a difference between a Direct Current (DC) voltage value of the clock signal and a DC voltage value of an inverted clock signal. For example, first invertor 304*a* is connected to the output terminal of phase interpolator 302. First invertor 304*a* receives the clock signal from phase interpolator 302 and inverts the clock signal to generate an inverted clock signal. First invertor 304*a* provides the inverted clock signal as an output at an output terminal.

Second invertor 304*b* is connected to first invertor 304*a*. Second invertor 304*b* receives the inverted clock signal from first invertor 304*a* and inverts the inverted clock signal to generate the clock signal. Second invertor 304*b* provides the clock signal as an output at an output terminal. First DC sampler 306*a* is connected to the output terminal of first invertor 304*a*. First DC sampler 306*a* determines an average DC voltage value of the inverted clock signal and provides the average DC voltage value of the inverted clock signal as an output at an output terminal. Second DC sampler 306*b* is connected to the output terminal of second invertor 304*a*. Second DC sampler 306*b* determines an average DC voltage value of the clock signal and provides the average DC voltage value of the clock signal as an output at an output terminal.

Error amplifier 308 is connected to both first DC sampler 306*a* and second DC sampler 306*b*. For example, a first input terminal of error amplifier 308 is connected to the output terminal of first DC sampler 306*a* and a second input terminal of error amplifier 308 is connected to the output terminal of second DC sampler 306*b*. Error amplifier 308 compares the average DC voltage value of the clock signal with the average DC voltage value of the inverted clock signal and provides a voltage signal as an output based on the comparison. The voltage signal is indicative of the difference between the average DC voltage value of the clock signal and the average DC voltage value of the inverted clock signal.

At block 940 of method 900, voltage/current alternator 310 connected to error amplifier 308 adjusts a duty cycle of the clock signal based on the determined difference between the DC voltage value of the clock signal and a DC voltage value of an inverted clock signal to substantially equal to 50%. For example, voltage/current alternator 310 determines if the difference between the average DC voltage value of the clock signal and the average DC voltage value of the inverted clock signal is substantially equal to zero. In response to determining that the difference between the average DC voltage value of the clock signal and the average DC voltage value of the inverted clock signal is not equal to zero, voltage/current alternator 310 minimizes the difference between the DC voltage value of the clock signal and a DC voltage value of an inverted clock signal to be substantially equal to zero to achieve the duty cycle substantially equal to 50%.

Thus, and in according to example embodiments, method 900 performs both the phase interpolation and the duty cycle correction in a single loop. After performing the phase interpolation and the duty cycle correction for the selected clock signal at a first phase value, method 900 may be repeated to perform phase interpolation and duty cycle correction for another phase value or multiple phase values.

In accordance with example embodiments, a clock synthesizer comprises: a Phase Locked Loop (PLL) configured to generate a clock signal based on a reference signal; a clock buffer connected to the PLL, wherein the clock buffer is configured to store the clock signal; and a Duty Cycle Controller and Phase Interpolator (DCCPI) circuit connected to the clock buffer, wherein the DCCPI circuit is configured to: receive the clock signal from the clock buffer, adjust a duty cycle of the clock signal to substantially equal to 50%, perform phase interpolation on the clock signal, and provide the clock signal as an output after adjusting the duty cycle substantially equal to 50% and performing the phase interpolation.

In example embodiments of the disclosure, a clock synthesizer comprises: a Digital Control Delay Line (DCDL) circuit; a Duty Cycle Controller and Phase Interpolator (DCCPI) circuit connected to the DCDL circuit, wherein the DCCPI circuit is configured to adjust a duty cycle of an input clock signal to substantially equal to 50% and provide an output clock signal; a replica circuit connected to the DCCPI circuit, wherein the replica circuit is operative to replicate the output clock signal and provide replica clock signal; a phase detection circuit connected to the replica circuit, wherein the phase detection circuit is operative to: compare the replica clock signal with a reference clock signal, and provide, to the DCCPI circuit, a voltage signal that represents a difference in phase between the replica clock signal and the reference clock signal, and wherein the DCCPI circuit is operative to adjust a duty cycle of the clock signal to substantially equal to 50% and interpolate a phase value of the clock signal based on the difference in the phase between the replica clock signal with the reference clock signal.

In accordance with example embodiments of the disclosure: a method of synthesizing clock, comprises: interpolating, by a phase interpolator, a phase value of an input clock signal to account for a time delay in distribution of a clock signal associated with the input clock signal; providing, by the phase interpolator, the clock signal associated with the input clock signal; determining, by an error amplifier connected to the phase interpolator, a difference between a Direct Current (DC) voltage value of the clock signal and a DC voltage value of an inverted clock signal; and adjusting, by a voltage current alternator connected to the error amplifier, a duty cycle of the clock signal based on the determined difference between the DC voltage value of the clock signal and the DC voltage value of the inverted clock signal to substantially equal to 50%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A clock synthesizer comprising:

a Duty Cycle Controller and Phase Interpolator (DCCPI) circuit, wherein the DCCPI circuit is configured to:

receive an input clock signal, and provide an output clock signal as an output from the input signal;

a replica circuit connected to an output of the DCCPI circuit, wherein the replica circuit is operative to replicate the output clock signal and provide a replica clock signal;

a phase detection circuit connected to the replica circuit, wherein the phase detection circuit is operative to:

compare the replica clock signal with a reference clock signal, and provide, to the DCCPI circuit, a voltage signal that represents a difference in phase between the replica clock signal and the reference clock signal; and wherein the DCCPI circuit is operative to:

adjust a duty cycle of the input clock signal, interpolate a phase value of the input clock signal based on the difference in the phase between the replica clock signal with the reference clock signal, wherein the DCCPI circuit being operative to interpolate the phase value comprises the DCCPI circuit being operative to shift a rising edge of the input clock signal, and provide duty adjusted and phase interpolated input signal as the output clock signal.

2. The clock synthesizer of claim 1, wherein the DCCPI circuit comprises a phase interpolator and a voltage/current alternator, and wherein:

the phase interpolator is configured to interpolate the phase value of the input clock signal, and the voltage/current alternator is configured to adjust a duty cycle of the clock signal based on a difference between an average Direct Current (DC) voltage value of the clock signal and an average DC voltage value of an inverted clock signal.

3. The clock synthesizer of claim 2, wherein the voltage/current alternator comprises a first cascade of transistors and a second cascade of transistors, wherein a number of switched on transistors in the first cascade of transistors are increased and a number of switched on transistors in the second cascade of transistors are decreased to decrease the duty cycle of the clock signal.

4. The clock synthesizer of claim 3, wherein each first transistors of the first cascade of transistors comprises p-channel Metal Oxide Semiconductor (PMOS) transistors, and wherein each second transistors of the second cascade of transistors comprises n-channel Metal Oxide Semiconductor (NMOS) transistors.

5. The clock synthesizer of claim 2, wherein the voltage/current alternator comprises a first cascade of transistors and a second cascade of transistors, wherein a number of switched on transistors in the first cascade of transistors are decreased and a number of switched on transistors in the second cascade of transistors are increased to increase the duty cycle of the clock signal.

6. The clock synthesizer of claim 2, further comprising a phase selector connected to the phase interpolator, wherein the phase selector is operative to:

select one or two phases of the input clock signal; and provide the selected one or two phases of the input clock signal to the phase interpolator.

7. The clock synthesizer of claim 1, wherein the DCCPI circuit comprises:

a first Direct Current (DC) sampler operative to determine an average DC voltage value of an inverted input clock signal;

a second DC sampler operative to determine an average DC voltage value of the input clock signal;

an error amplifier connected to the first DC sampler and the second DC sampler, wherein the error amplifier is operative to determine the difference between the average DC voltage value of the inverted input clock signal and the average DC voltage value of the input clock signal; and a voltage/current alternator connected to the error amplifier, and wherein the voltage/current alternator is operative to adjust the duty cycle of the input clock signal based on the difference between the average DC voltage value of the inverted input clock signal and the average DC voltage value of the input clock signal.

8. A clock synthesizer comprising:

a Duty Cycle Controller and Phase Interpolator (DCCPI) circuit, wherein the DCCPI circuit is configured to:

receive an input clock signal, perform phase interpolation on the input clock signal, adjust a duty cycle of the input clock signal based on a difference between an average Direct Current (DC) voltage value of the clock signal and an average DC voltage value of an inverted clock signal, and provide an output clock signal as an output after adjusting the duty cycle;

a replica circuit connected to the DCCPI circuit, wherein the replica circuit is operative to replicate the output clock signal and provide a replica clock signal;

a phase detection circuit connected to the replica circuit, wherein the phase detection circuit is operative to:

compare the replica clock signal with a reference clock signal, and provide, to the DCCPI circuit, a voltage signal that represents a difference in phase between the replica clock signal and the reference clock signal; and wherein the DCCPI circuit is operative to:

interpolate a phase value of the input clock signal based on the difference in the phase between the replica clock signal with the reference clock signal, and provide duty adjusted and phase interpolated input signal as the output clock signal.

9. The clock synthesizer of claim 8, wherein the DCCPI circuit comprises:

a first Direct Current (DC) sampler operative to determine an average DC voltage value of an inverted input clock signal;

a second DC sampler operative to determine an average DC voltage value of the clock signal;

an error amplifier connected to the first DC sampler and the second DC sampler, wherein the error amplifier is operative to determine the difference between the average DC voltage value of the inverted clock signal and the average DC voltage value of the clock signal; and a voltage/current alternator connected to the error amplifier, and wherein the voltage/current alternator is operative to adjust the duty cycle of the input clock signal based on the difference between the average DC voltage value of the inverted clock signal and the average DC voltage value of the clock signal.

10. The clock synthesizer of claim 8, wherein the DCCPI circuit comprises a phase interpolator and a voltage/current alternator, and wherein:

the phase interpolator is configured to interpolate the phase value of the input clock signal, and the voltage/current alternator is configured to adjust a duty cycle of the clock signal based on a difference between an average Direct Current (DC) voltage value of the input clock signal and an average DC voltage value of an inverted input clock signal.

11. The clock synthesizer of claim 10, wherein the voltage/current alternator comprises a first cascade of transistors and a second cascade of transistors, wherein a number of switched on transistors in the first cascade of transistors are increased and a number of switched on transistors in the second cascade of transistors are decreased to decrease the duty cycle of the clock signal.

12. The clock synthesizer of claim 11, wherein each first transistors of the first cascade of transistors comprises p-channel Metal Oxide Semiconductor (PMOS) transistors, and wherein each second transistors of the second cascade of transistors comprises n-channel Metal Oxide Semiconductor (NMOS) transistors.

13. The clock synthesizer of claim 10, wherein the voltage/current alternator comprises a first cascade of transistors and a second cascade of transistors, wherein a number of switched on transistors in the first cascade of transistors are decreased and a number of switched on transistors in the second cascade of transistors are increased to increase the duty cycle of the clock signal.

14. The clock synthesizer of claim 10, further comprising a phase selector connected to the phase interpolator, wherein the phase selector is operative to:

select one or two phases of the input clock signal; and provide the selected one or two phases of the input clock signal to the phase interpolator.

15. The clock synthesizer of claim 1, wherein the DCCPI circuit being operative to interpolate the phase value comprises the DCCPI circuit being operative to shift a rising edge of the input clock signal.

16. A method of synthesizing a clock signal, the method comprising:

replicating, by a replica circuit connected to an output of a Duty Cycle Controller and Phase Interpolator (DCCPI) circuit, an output clock signal of DCCPI circuit;

comparing, by a phase detection circuit connected to the replica circuit, the replica clock signal with a reference clock signal;

providing, by the phase detection circuit to the DCCPI circuit, a voltage signal that represents a difference in phase between the replica clock signal and the reference clock signal;

adjusting, by the DCCPI circuit, a duty cycle of the input clock signal;

interpolating, by the DCCPI circuit, a phase value of the input clock signal based on the difference in the phase between the replica clock signal with the reference clock signal, wherein interpolating the phase value comprises shifting a rising edge of the input clock signal; and providing, by the DCCPI circuit, duty adjusted and phase interpolated input signal as the output clock signal.

17. The method of claim 16, wherein interpolating the phase value of the input clock signal comprises interpolating the phase value of the input clock signal to account for a time delay in distribution of the output clock signal in a clock tree.

18. The method of claim 16, further comprising:

determining, by an error amplifier of the DCCPI circuit, a difference between a Direct Current (DC) voltage value of the clock signal and a DC voltage value of an inverted clock signal; and adjusting, by a voltage current alternator connected to the error amplifier of the DCCPI circuit, the duty cycle of the clock signal based on the determined difference between the DC voltage value of the clock signal and the DC voltage value of the inverted clock signal to substantially equal to 50%.

19. The method of claim 18, wherein determining the difference between the DC voltage value of the clock signal and the DC voltage value of the inverted clock signal comprises:

generating, by a first invertor connected to the phase interpolator, an inverted clock signal by inverting the clock signal;

determining, by a first Direct Current (DC) sampler connected to the first invertor, an average DC voltage value of the inverted clock signal;

generating, by a second invertor connected to the first invertor, the clock signal by inverting the inverted clock signal;

determining, by a second DC sampler connected to the second invertor, an average DC voltage value of the clock signal; and determining, by the error amplifier connected to the first DC sampler and the second DC sampler, a difference between the average DC voltage value of the inverted clock signal and the average DC voltage value of the clock signal.

20. The method of claim 16, wherein the DCCPI circuit comprises a phase interpolator and a voltage/current alternator.

* * * * *